(12) United States Patent
Hazama et al.

(10) Patent No.: US 12,090,746 B2
(45) Date of Patent: Sep. 17, 2024

(54) RADIO WAVE ABSORBING MATERIAL AND RADIO WAVE ABSORBING SHEET

(71) Applicant: DAIKIN INDUSTRIES, LTD., Osaka (JP)

(72) Inventors: Takeshi Hazama, Osaka (JP); Nobuyuki Komatsu, Osaka (JP); Kouji Yokotani, Osaka (JP); Mayuko Tatemichi, Osaka (JP); Akio Higaki, Osaka (JP); Tomohiro Tanaka, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 768 days.

(21) Appl. No.: 17/043,343

(22) PCT Filed: Mar. 26, 2019

(86) PCT No.: PCT/JP2019/012927
§ 371 (c)(1),
(2) Date: Sep. 29, 2020

(87) PCT Pub. No.: WO2019/189214
PCT Pub. Date: Oct. 3, 2019

(65) Prior Publication Data
US 2021/0023818 A1  Jan. 28, 2021

(30) Foreign Application Priority Data
Mar. 30, 2018 (JP) .................................. 2018-067703

(51) Int. Cl.
*B32B 7/025* (2019.01)
*B32B 27/30* (2006.01)
*C08F 214/18* (2006.01)

(52) U.S. Cl.
CPC .............. *B32B 7/025* (2019.01); *B32B 27/30* (2013.01); *C08F 214/18* (2013.01)

(58) Field of Classification Search
None
See application file for complete search history.

(56) References Cited

U.S. PATENT DOCUMENTS

| | | |
|---|---|---|
| 2004/0054029 A1 | 3/2004 | Fujiki et al. |
| 2004/0108486 A1 | 6/2004 | Yoshida et al. |
| 2007/0166562 A1 | 7/2007 | Swei et al. |

(Continued)

FOREIGN PATENT DOCUMENTS

| | | |
|---|---|---|
| CN | 1528002 A | 9/2004 |
| CN | 103009737 A | 4/2013 |

(Continued)

OTHER PUBLICATIONS

Extended European Search Report issued Nov. 18, 2021 in corresponding European Application No. 19776903.7.
(Continued)

*Primary Examiner* — Whitney Moore
(74) *Attorney, Agent, or Firm* — Sughrue Mion, PLLC

(57) ABSTRACT

A radio wave absorbing material including a fluoropolymer. The fluoropolymer contains a vinylidene fluoride unit, and the radio wave absorbing material absorbs a radio wave having a frequency in a range of 1 MHz to 100 MHz.

5 Claims, 3 Drawing Sheets

(56) References Cited

U.S. PATENT DOCUMENTS

| | | | |
|---|---|---|---|
| 2010/0283000 A1* | 11/2010 | Shimizu | B29C 48/845 |
| | | | 252/511 |
| 2012/0261182 A1* | 10/2012 | Megaridis | C08L 27/16 |
| | | | 977/773 |
| 2013/0120959 A1 | 5/2013 | Wano et al. | |
| 2013/0188293 A1* | 7/2013 | Koh | C08F 214/262 |
| | | | 524/413 |
| 2013/0281558 A1 | 10/2013 | Sawada et al. | |
| 2014/0142209 A1* | 5/2014 | Shiotani | C08F 214/22 |
| | | | 528/392 |
| 2016/0019996 A1* | 1/2016 | Ghosh | C08K 3/22 |
| | | | 252/516 |
| 2018/0201739 A1 | 7/2018 | Iacob et al. | |

FOREIGN PATENT DOCUMENTS

| | | |
|---|---|---|
| CN | 103261314 A | 8/2013 |
| JP | 1-20521 B2 | 4/1989 |
| JP | 7-30279 A | 1/1995 |
| JP | 9-35927 A | 2/1997 |
| JP | 2001-274007 A | 10/2001 |
| JP | 2006-93288 A | 4/2006 |
| JP | 2007-208121 A | 8/2007 |
| JP | 2011-249614 A | 12/2010 |
| JP | 2015-12713 A | 1/2015 |
| JP | 2018-002774 A | 1/2018 |
| WO | 2017/001805 A1 | 1/2017 |
| WO | 2018/008421 A1 | 1/2018 |

OTHER PUBLICATIONS

International Search Report for PCT/JP2019/012927 dated, Jun. 18, 2019 (PCT/ISA/210).

International Preliminary Report on Patentability with a Translation of Written Opinion in International Application No. PCT/JP2019/012927, issued on Oct. 6, 2020.

* cited by examiner

RADIO WAVE ABSORBING MATERIAL AND RADIO WAVE ABSORBING SHEET

CROSS REFERENCE TO RELATED APPLICATIONS

This application is a National Stage of International Application No. PCT/JP2019/012927 filed Mar. 26, 2019, claiming priority based on Japanese Patent Application No. 2018-067703 filed Mar. 30, 2018.

TECHNICAL FIELD

The present disclosure relates to a radio wave absorbing material and a radio wave absorbing sheet.

BACKGROUND ART

A radio wave absorbing material is utilized for measure against noise for electric and electronic devices and other purposes.

Patent Document 1, for example, proposes, as a radio wave absorbing material, a dielectric sheet composed of a sheet formed by drying a coating film of a coating liquid containing a resin and a natural graphite powder having an average grain size of 10 μm or less and having a thickness of 5 to 30 μm.

RELATED ART

Patent Documents

Patent Document 1: Japanese Patent Laid-Open No. 2011-249614

SUMMARY OF THE INVENTION

Problem to be Solved by the Invention

An object of the present disclosure is to provide a novel radio wave absorbing material that can absorb a radio wave having a frequency in a range of 1 MHz to 100 MHz.

Means for Solving the Problem

According to the present disclosure, a radio wave absorbing material containing a fluoropolymer is provided.

In the radio wave absorbing material of the present disclosure, the fluoropolymer preferably contains a vinylidene fluoride unit, and more preferably contains a vinylidene fluoride and a tetrafluoroethylene unit. In this case, vinylidene fluoride unit/tetrafluoroethylene unit is preferably 5/95 to 95/5 in terms of a molar ratio.

The radio wave absorbing material of the present disclosure preferably absorbs a radio wave having a frequency in a range of 1 MHz to 100 MHz.

The radio wave absorbing material of the present disclosure is suitably used for shielding an electromagnetic wave from a wireless power supply module by absorbing the electromagnetic wave generated from the wireless power supply module.

According to the present disclosure, a radio wave absorbing sheet including a radio wave absorbing layer formed from the above-described radio wave absorbing material is also provided.

According to the present disclosure, a radio wave absorbing sheet including: a radio wave absorbing layer formed from the above-described radio wave absorbing material; and an additional layer different from the radio wave absorbing layer is also provided.

Effects of Invention

According to the present disclosure, a novel radio wave absorbing material that can absorb a radio wave having a frequency in a range of 1 MHz to 100 MHz may be provided.

DESCRIPTION OF EMBODIMENTS

Figure 1:
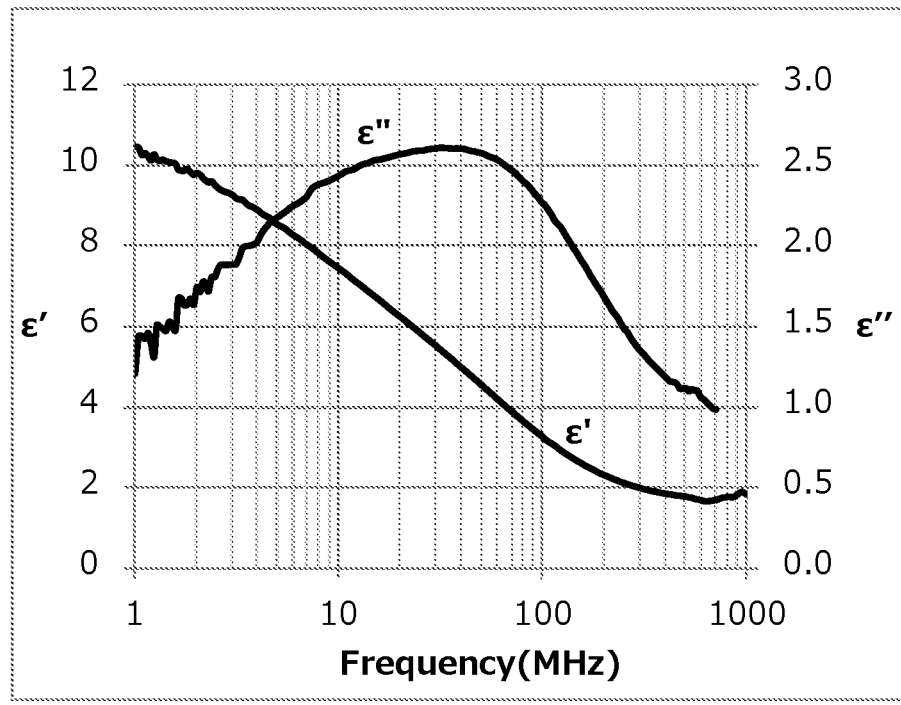
FIG. 1 is a graph showing a dielectric constant $\varepsilon'$ and a dielectric loss $\varepsilon''$ of a sheet obtained in Example 1.

Hereinafter, specific embodiments of the present disclosure will be described in detail, but the present disclosure is not limited to the following embodiments.

A radio wave absorbing material of the present disclosure contains a fluoropolymer.

The fluoropolymer is preferably a fluororesin. The fluororesin is a partially crystalline fluoropolymer and is a fluoroplastic, not a fluoroelastomer. The fluororesin has a melting point and has thermoplasticity, but is, in some embodiments, melt-fabricable or non melt-processible.

The melting point of the fluoropolymer is preferably 180° C. or higher, more preferably 190° C. or higher, and is preferably 320° C. or lower, more preferably 280° C. or lower. The melting point is defined as a temperature at a peak of an endothermic curve which is obtained when thermal measurement is performed using a differential scanning calorimeter in accordance with ASTM D-4591 at a temperature-increasing rate of 10° C./min.

Examples of the fluoropolymer include polytetrafluoroethylene [PTFE], a tetrafluoroethylene/perfluoro(alkyl vinyl ether) copolymer [PFA], a tetrafluoroethylene/hexafluoropropylene copolymer [FEP], an ethylene/tetrafluoroethylene copolymer [ETFE], an ethylene/tetrafluoroethylene/hexafluoropropylene copolymer, polychlorotrifluoroethylene [PCTFE], a chlorotrifluoroethylene/tetrafluoroethylene copolymer, an ethylene/chlorotrifluoroethylene copolymer, polyvinyl fluoride [PVF], and a fluoropolymer containing a vinylidene fluoride (VdF) unit.

Among others, the fluoropolymer is preferably a fluoropolymer containing a VdF unit because such a fluoropolymer may sufficiently absorb a radio wave having a frequency in a range of 1 MHz to 100 MHz.

In some embodiments, the fluoropolymer containing a VdF unit is a VdF homopolymer consisting of the VdF unit alone or a polymer containing a VdF unit and a unit based on a monomer copolymerizable with VdF.

Examples of the monomer copolymerizable with VdF include a fluorinated monomer and a non fluorinated monomer, and a fluorinated monomer is preferable. Examples of the fluorinated monomer include vinyl fluoride, trifluoroethylene (TrFE), tetrafluoroethylene (TFE), chlorotrifluoroethylene (CTFE), a fluoroalkyl vinyl ether, hexafluoropropylene (HFP), a (perfluoroalkyl)ethylene, 2,3,3,3-tetrafluoropropene, and trans-1,3,3,3-tetrafluoropropene. Examples of the non fluorinated monomer include ethylene and propylene.

In addition, examples of the monomer copolymerizable with VdF also include polar group-containing monomers, such as a hydroxyalkyl (meth)acrylate, (meth)acrylic acid, an alkylidene malonic acid ester, a vinyl carboxy alkyl ether, a carboxy alkyl (meth) acrylate, a (meth)acryloyloxy alkyldicarboxylic acid ester, and a monoester of an unsaturated dibasic acid.

The fluoropolymer is more preferably at least one selected from the group consisting of polyvinylidene fluoride (PVdF), a VdF/TFE copolymer, a VdF/TrFE copolymer, a VdF/TFE/HFP copolymer, and a VdF/HFP copolymer, still more preferably at least one selected from the group consisting of PVdF, a VdF/TFE copolymer, and a VdF/TrFE copolymer, particularly preferably at least one selected from the group consisting of a VdF/TFE copolymer and a VdF/TrFE copolymer, and most preferably a VdF/TFE copolymer because such fluoropolymers may sufficiently absorb a radio wave having a frequency in a range of 1 MHz to 100 MHz.

PVdF is a VdF homopolymer consisting of a VdF unit alone, or a polymer containing a VdF unit and a small amount of a unit based on a monomer copolymerizable with VdF. The content of the unit based on the monomer copolymerizable with VdF in PVdF is preferably 0.10 to 8.0 mol %, more preferably 0.50 mol % or more, and more preferably less than 5.0 mol % based on the total amount of the monomer units.

In some embodiments, the monomer which PVdF may contain and which is copolymerizable with VdF is the above-mentioned monomer copolymerizable with VdF, but, among others, is preferably at least one fluorinated monomer selected from the group consisting of CTFE, a fluoroalkyl vinyl ether, HFP, and 2,3,3,3-tetrafluoropropene.

The VdF/HFP copolymer having a molar ratio of VdF/HFP of 45/55 to 85/15 is preferable. The molar ratio of VdF/HFP is more preferably 50/50 to 80/20, still more preferably 60/40 to 80/20. The VdF/HFP copolymer is a copolymer containing a polymerization unit based on VdF and a polymerization unit based on HFP, and has, in some embodiments, a polymerization unit based on an additional fluorine-containing monomer. For example, a VdF/HFP/TFE copolymer is one of preferred embodiments.

The VdF/HFP/TFE copolymer having a molar ratio of VdF/HFP/TFE of 40 to 80/10 to 35/10 to 25 is preferable. It is to be noted that the VdF/HFP/TFE copolymer is a resin or an elastomer, but is usually a resin when having the range of compositional features.

The VdF/TrFE copolymer is a copolymer containing a VdF unit and a TrFE unit. In the copolymer, the content ratio of the VdF unit to the TrFE unit is preferably 5/95 to 95/5, more preferably 10/90 to 90/10 in terms of a molar ratio of VdF unit/TrFE unit because the copolymer having such a content ratio may sufficiently absorb a radio wave having a frequency in a range of 1 MHz to 100 MHz.

The VdF/TFE copolymer is a copolymer containing a VdF unit and a TFE unit. In the copolymer, the content ratio of the VdF unit to the TFE unit is preferably 5/95 to 95/5, more preferably 5/95 to 90/10, still more preferably 5/95 to 75/25, particularly preferably 15/85 to 75/25, and most preferably 36/64 to 75/25 in terms of a molar ratio of VdF unit/TFE unit because the copolymer having such a content ratio may sufficiently absorb a radio wave having a frequency in a range of 1 MHz to 100 MHz.

Moreover, in the copolymer, the content ratio of the VdF unit to the TFE unit is preferably 95/5 to 63/37, more preferably 90/10 to 70/30, and still more preferably 85/15 to 75/25 in terms of a molar ratio of VdF unit/TFE unit because the copolymer having such a content ratio may sufficiently absorb a radio wave having a frequency in a range of 1 MHz to 100 MHz. It is preferable that the amount of the VdF unit in the copolymer be relatively large in that such a copolymer is excellent in solvent solubility and the radio wave absorbing material is excellent in processability.

Furthermore, in the copolymer, the content ratio of the VdF unit to the TFE unit is preferably 60/40 to 10/90, more preferably 50/50 to 15/85, and still more preferably 45/55 to 20/80 in terms of a molar ratio of VdF unit/TFE unit because the copolymer having such a content ratio may sufficiently absorb a radio wave having a frequency in a range of 1 MHz to 100 MHz. It is preferable that the amount of the TFE unit in the copolymer be relatively large in that the radio wave absorbing material is excellent in heat resistance.

The VdF/TFE copolymer preferably further contains a polymerization unit of an ethylenically unsaturated monomer (however, VdF and TFE are excluded). In some embodiments, the content of the polymerization unit of the ethylenically unsaturated monomer is 0 to 50% by mol %, 0 to 40 mol %, 0 to 30 mol %, 0 to 15 mol %, or 0 to 5 mol % based on the total amount of the polymerization units.

The ethylenically unsaturated monomer is not limited as long as it is a monomer copolymerizable with VdF and TFE, but is preferably at least one selected from the group consisting of ethylenically unsaturated monomers represented by the following formulas (1) and (2).

$$CX^1X^2=CX^3(CF_2)_nX^4 \quad \text{Formula (1):}$$

wherein $X^1$, $X^2$, $X^3$, and $X^4$ are the same or different and each represent H, F, or Cl, and n represents an integer of 0 to 8; however, VdF and TFE are excluded.

$$CF_2=CF—ORf^1 \quad \text{Formula (2):}$$

wherein $Rf^1$ represents a C1-3 alkyl group or a C1-3 fluoroalkyl group.

The ethylenically unsaturated monomer represented by formula (1) is preferably at least one selected from the group consisting of $CF_2=CFCl$, $CF_2=CFCF_3$, the following formula (3):

$$CH_2=CF—(CF_2)_nX^4 \quad (3),$$

wherein $X^4$ and n are the same as those described above, and the following formula (4):

$$CH_2=CH—(CF_2)_nX^4 \quad (4)$$

wherein $X^4$ and n are the same as those described above, more preferably at least one selected from the group consisting of $CF_2=CFCl$, $CH_2=CFCF_3$, $CH_2=CH—C_4F_9$, $CH_2=CH—C_6F_{13}$, $CH_2=CF—C_3F_6H$, and $CF_2=CFCF_3$, and still more preferably at least one selected from the group consisting of $CF_2=CFCl$, $CH_2=CH—C_6F_{13}$, and $CH_2=CFCF_3$.

The ethylenically unsaturated monomer represented by formula (2) is preferably at least one selected from the group consisting of $CF_2=CF—OCF_3$, $CF_2=CF—OCF_2CF_3$, and $CF_2=CF—OCF_2CF_2CF_3$.

The melt flow rate (MFR) of the fluoropolymer is preferably 0.1 to 100 g/10 min, more preferably 0.1 to 50 g/10 min. The MFR is in accordance with ASTM D3307-01 and is the mass of the polymer flowing out of a nozzle having an inner diameter of 2 mm and a length of 8 mm per 10 minutes (g/10 min) at 297° C. under a load of 5 kg.

The initial pyrolysis temperature (1% mass reduction temperature) of the fluoropolymer is preferably 360° C. or higher, more preferably 370° C. or higher, and is preferably 410° C. or lower. The initial pyrolysis temperature is a temperature at which 1% by mass of the fluoropolymer provided for a heating test decomposes, and is a value which is obtained by measuring a temperature at which the mass of the copolymer provided for the heating test is reduced by 1% by mass with a thermogravimetric/differential thermal analyzer [TG-DTA].

The fluoropolymer preferably has a storage modulus (E') of 60 to 400 MPa, the storage modulus measured at 170° C. by dynamic viscoelasticity measurement.

The storage modulus is a value which is obtained by dynamic viscoelasticity measurement at 170° C., and is more specifically a value which is obtained by measurement with a dynamic viscoelasticity analyzer using a sample having a length of 30 mm, a width of 5 mm, and a thickness of 0.25 mm under a condition where the measurement mode is a tension mode, the gripping width is 20 mm, the setting temperature is 25° C. to 250° C., the temperature-increasing rate is 2° C./min, and the frequency is 1 Hz. At 170° C., preferred storage modulus (E') is 80 to 350 MPa, and more preferred storage modulus (E') is 100 to 350 MPa.

A measurement sample may be made in such a way that, for example, a film molded into a thickness of 0.25 mm with a pressure of 3 MPa setting the molding temperature to a temperature 50 to 100° C. higher than the melting point of the copolymer is cut into a length of 30 mm and a width of 5 mm.

The radio wave absorbing material of the present disclosure may absorb a radio wave having a frequency in a range of 1 MHz to 100 MHz even in the case where the radio wave absorbing material contains a fluoropolymer alone. The present inventors have found an astonishing property that a fluoropolymer absorbs a radio wave having a frequency in a range of 1 MHz to 100 MHz. The radio wave absorbing material of the present disclosure is the invention completed based on this knowledge. Accordingly, the radio wave absorption of the radio wave absorbing material of the present disclosure is preferably 1 dB or more, more preferably 4 dB or more, still more preferably 7 dB or more, further still more preferably 10 dB (90% absorption) or more, particularly preferably 20 dB (99% absorption) or more, and most preferably 30 dB (99.9% absorption) or more in terms of a radio wave having a frequency in a range of 1 MHz to 100 MHz. When the radio wave absorption is in the range, it may be said that the radio wave absorbing material is absorbing a radio wave sufficiently. The radio wave absorption may be measured by, for example, an Electric Wave Absorber Return Loss Measurement System (manufactured by KEYCOM Corporation, Low frequency Micro Strip Line method). In some embodiments, the radio wave absorption is a value with respect to a radio wave having a particular frequency in a range where the frequency is 1 MHz to 100 MHz. In other words, in some embodiments, the radio wave absorption is the maximum radio wave absorption in a range where the frequency is 1 MHz to 100 MHz.

The dielectric constant ε' of the radio wave absorbing material of the present disclosure is preferably 2 to 20, more preferably 3 to 15. In addition, the dielectric tangent (tan δ) of the radio wave absorbing material of the present disclosure is preferably 0.01 to 1.0, more preferably 0.05 to 0.8. The dielectric constant ε' and the dielectric tangent are values in a range where the frequency is 1 MHz to 100 MHz. When the dielectric constant ε' and the dielectric tangent are in such ranges, it may be said that the radio wave absorbing material is absorbing a radio wave sufficiently. In some embodiments, the dielectric constant ε' and the dielectric tangent are values with respect to a radio wave having a particular frequency in a range where the frequency is 1 MHz to 100 MHz.

The radio wave absorbing material of the present disclosure further has transparency and softness, and these effects are particularly remarkable when the fluoropolymer contains a VdF unit. Besides, when the fluoropolymer contains a VdF unit, a solution may be prepared by dissolving the fluoropolymer in a low-boiling-point solvent, and a coating film is also obtained from the solution by drying at a low temperature, and therefore an adverse influence on a coated object due to exposure of the coating film to a high temperature may be avoided. Further, the radio wave absorbing material of the present disclosure is also excellent in the electric non-conductance, the weather resistance, and the chemical resistance, accordingly a protection effect, such as suppressing corrosion or the like of the coated object, may also be expected, and these effects are retained over a long period of time. Besides, there is also an advantage that the radio wave absorbing material of the present disclosure, when constituted by a fluoropolymer alone, is more lightweight as compared to a conventional radio wave absorbing material containing a magnetic substance or the like.

The radio wave absorbing material of the present disclosure exhibits excellent properties in this way even when containing a fluoropolymer alone, but may also contain an additional component other than the fluoropolymer.

Examples of the additional component include a dielectric and a magnetic substance, and when the radio wave absorbing material of the present disclosure contains a dielectric and a magnetic substance, the radio wave absorption with respect to a radio wave having a frequency band in a range of 1 MHz to 100 MHz may be optimized, and, in addition, absorption of not only the radio wave which the fluoropolymer absorbs and which has a frequency band in a range of 1 MHz to 100 MHz but also a radio wave having another frequency band is enabled. Particularly, the radio wave absorbing material of the present disclosure preferably contains a magnetic substance because a synergistic effect with the fluoropolymer may be expected and a wideband radio wave may be absorbed.

Examples of the dielectric include carbon (carbon black, carbon graphite, carbon fiber) and titanium oxide. Examples of the magnetic substance include ferrite, iron, and an iron alloy. The shapes of the dielectric and the magnetic substance are not limited, and, in some embodiments, each of the shapes is a particle, a fiber, or the like.

Examples of the iron alloy include pure iron, an iron-silicon alloy, an iron-silicon-aluminum alloy, an iron-chromium alloy, an iron-nickel alloy, an iron-chromium-nickel alloy, an iron-cobalt alloy, and an amorphous alloy.

Examples of the iron include carbonyl iron.

In addition, examples of the ferrite include manganese zinc ferrite, magnesium zinc ferrite, nickel zinc ferrite, copper-zinc ferrite, manganese-magnesium-zinc ferrite, manganese-magnesium-aluminum ferrite, yttrium iron oxide ferrite, and manganese-copper-zinc ferrite.

The radio wave absorbing material of the present disclosure may also contain a polymer other than the fluoropolymer, a heat dissipation agent, a flame retarder, and the like.

The radio wave absorbing material of the present disclosure is molded into various shapes according to the intended uses to be provided. The molding method is not limited, and a spin coating method, a drop casting method, a dip-nip method, a spray coating method, a brush painting method, a dipping method, an inkjet printing method, an electrostatic spray coating method, a compression molding method, an extrusion method, a calendering method, a transfer molding method, an injection molding method, a rotomolding method, a rotolining molding method, and the like may be adopted.

The shape of the radio wave absorbing material of the present disclosure is not limited and is, in some embodiments, a shape of a sheet or the like. Particularly, the radio wave absorbing material of the present disclosure is preferably a sheet, more preferably a radio wave absorbing sheet. That is, a radio wave absorbing sheet including a radio wave absorbing layer formed from the radio wave absorbing material is also included in the present disclosure. In addition, a radio wave absorbing property may also be imparted to a covered object or a coated object by pasting a sheet to the covered object or by applying a solution, which will be mentioned later, on the coated object.

The method for producing the sheet is not limited, and examples thereof include a method of subjecting the fluoropolymer which is used in the present disclosure to melt extrusion. The melt extrusion may be performed at 250 to 380° C. In addition, the melt extrusion may be performed using a melt-extruder, and the cylinder temperature and the die temperature are preferably set to 250 to 350° C. and 300 to 380° C., respectively.

A stretched sheet may be obtained by further stretching the sheet obtained by extrusion. In some embodiments, the stretching is uniaxial stretching or biaxial stretching.

With respect to the method for producing the sheet, the sheet may also be produced by dissolving a fluoropolymer which is used in the present disclosure in an organic solvent to prepare a solution and then applying the solution. The fluoropolymer which is used in the present disclosure may also be dissolved in a low-boiling-point solvent, as mentioned above, and therefore the solvent which is used in dissolving the fluoropolymer is preferably a low-boiling-point, general-purpose organic solvent such as: a nitrogen-containing organic solvent, such as N-methyl-2-pyrrolidone, N,N-dimethylacetamide, or dimethyl formamide; a ketone solvent, such as acetone, methyl ethyl ketone, cyclohexanone, or methyl isobutyl ketone; an ester solvent, such as ethyl acetate or butyl acetate; or an ether solvent, such as tetrahydrofuran or dioxane, is preferable.

In addition, when the radio wave absorbing material of the present disclosure contains an additional component, such as a dielectric or a magnetic substance, the sheet may be produced by mixing the fluoropolymer, the additional component, and an organic solvent to prepare a slurry and then applying the slurry.

In some embodiments, the sheet may also be a multilayer sheet including: a radio wave absorbing layer formed from the radio wave absorbing material of the present disclosure; and an additional layer. That is, a radio wave absorbing sheet including: a radio wave absorbing layer formed from the radio wave absorbing material; and an additional layer different from the radio wave absorbing layer is also included in the present disclosure.

The additional layer in the multilayer sheet and the radio wave absorbing sheet is preferably a radio wave reflecting layer formed from a radio wave reflecting material. Examples of the radio wave reflecting material include electrically conductive sheets and electrically conductive films, such as a metal foil, a metal-deposited film, a metallic fiber nonwoven fabric, a carbon fiber fabric, and a metal-plated glass fiber fabric. The thickness of the radio wave reflecting layer is preferably 0.01 to 10 mm.

In some embodiments, the sheet may also be a sheet including an adhesion layer for allowing the radio wave absorbing layer and the additional layer to adhere to each other. The adhesion layer may be formed with an adhesive. Examples of the adhesive include an acrylic-based adhesive, an epoxy-based adhesive, and a silicon-based adhesive.

The thickness of the radio wave absorbing layer in the sheet is a practically allowable thickness and is preferably 0.001 to 10 mm, more preferably 0.01 to 10 mm, still more preferably 0.01 to 1 mm, and particularly preferably 0.1 to 0.5 mm because the radio wave may be absorbed sufficiently.

The radio wave absorbing material of the present disclosure may particularly be used for absorbing a radio wave having a frequency in a range of 1 MHz to 100 MHz. Accordingly, the radio wave absorbing material of the present disclosure may suitably be utilized as a radio wave absorbing material for suppressing noise generated inside of an electronic device; a radio wave absorbing material for suppressing an electromagnetic wave radiated outside from an electronic device; a radio wave absorbing material for reducing an influence of an electromagnetic wave from the outside of an electronic device; or the like. For example, the radio wave absorbing material of the present disclosure may be used by being installed around an electromagnetic wave generation source, such as a wireless power supply module, or by being pasted to an electronic component which is affected by an electromagnetic wave from an electromagnetic wave generation source.

The wireless power supply module is also included in the electronic device. Wireless power supply is a technique of transmitting power in a noncontact manner, and the principle thereof may be classified into a non-radiative type and a radiative type. The radio wave absorbing material of the present disclosure particularly absorbs a radio wave having a frequency in a range of 1 MHz to 100 MHz and therefore is useful for measure against noise generated in non-radiative type wireless power supply. The non-radiative type may further be classified into an electromagnetic induction type and a magnetic resonance type, and the radio wave absorbing material of the present disclosure may be used for any of them. Various problems which arise due to noise generated in wireless power supply, such as an increase in radiated emission and suppression of receiver sensitivity in radio communication, may be solved by using the radio wave absorbing material of the present disclosure. Accordingly, in the present disclosure, it is one of the preferred embodiments to use the radio wave absorbing material for shielding an electromagnetic wave from a wireless power supply module by absorbing the electromagnetic wave generated from the wireless power supply module.

The radio wave absorbing material of the present disclosure is also useful as a radio wave absorbing material for improving the properties of an antenna for wireless power supply, or a radio wave absorbing material for improving the properties of an antenna for near field communication.

The radio wave absorbing material of the present disclosure may also be used as an IC (integrated circuit) package, as a module substrate, for forming a high dielectric constant layer integrated with an electronic component, and particularly as an inner layer capacitor layer of a multilayer wiring board.

The above-mentioned use of a fluoropolymer as a radio wave absorbing material is also included in one embodiment of the present disclosure.

EXAMPLES

Hereinafter, embodiments of the present disclosure will be described giving Examples, but the present disclosure is not limited to only these Examples.

Respective numerical values in Examples were measured by the following methods.

Compositional Features of Monomers of Fluoropolymer $^{19}$F-NMR measurement was performed using a nuclear magnetic resonance apparatus and setting the measurement temperature to (melting point of polymer+20)° C. to determine the compositional features of monomers of each fluoropolymer from the integrated values of respective peaks, or by appropriately combining $^{19}$F-NMR measurement and elemental analysis depending on the types of the monomers.

Film Thickness

The film thickness of each film placed on a substrate was measured at room temperature using a digital length-measuring machine.

Example 1

As a fluoropolymer, a VdF/TFE copolymer containing 40 mol % of a VdF unit and 60 mol % of a TFE unit was used. A pellet of this VdF/TFE copolymer was formed into a film with a melt-extruder at 290 to 360° C. to obtain a sheet having a thickness of 80 μm. This sheet was stretched by 4×4 times with a biaxial stretching machine at 70° C. to obtain a sheet having a thickness of 5 μm.

The dielectric constant ε' and the dielectric tangent (tan δ=ε"/ε') of the obtained sheet having a thickness of 5 μm were measured at 25° C. using 4291B RF Impedance Analyzer 1 MHz to 1 GHz manufactured by Agilent Technologies, Inc. as an impedance analyzer and using 16453A Dielectric Material Test Fixture manufactured by Agilent Technologies, Inc. to as a dielectric material test fixture to determine the dielectric loss ε". FIG. 1 shows the results.

Example 2

Figure 2:
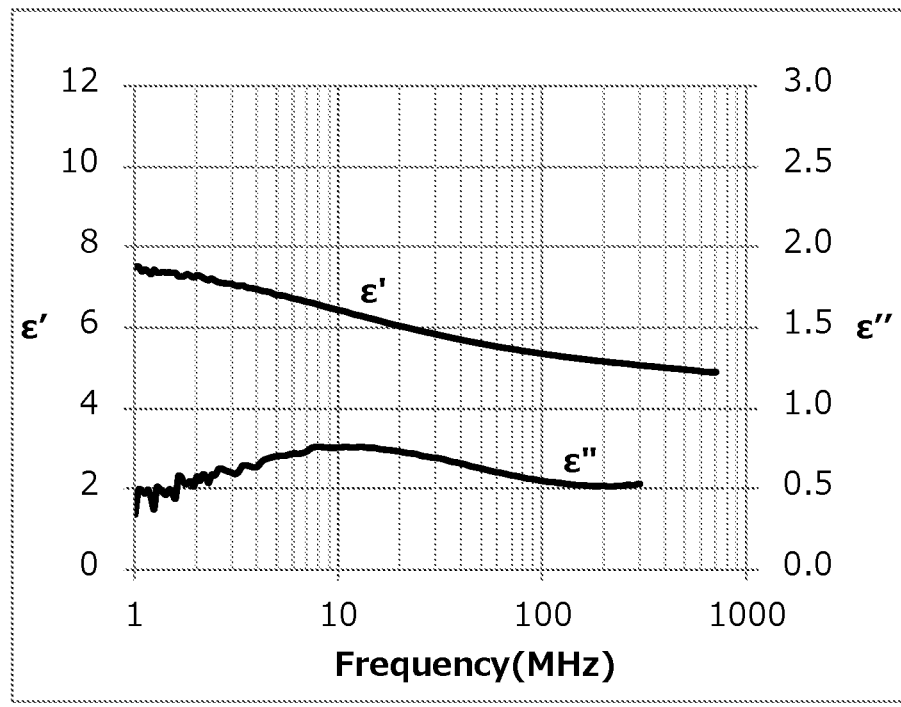
FIG. 2 is a graph showing a dielectric constant $\varepsilon'$ and a dielectric loss $\varepsilon''$ of a sheet obtained in Example 2.

As a fluoropolymer, a VdF/TFE copolymer containing 40 mol % of a VdF unit and 60 mol % of a TFE unit was used. A pellet of this VdF/TFE copolymer was formed into a film with a melt-extruder at 290 to 360° C. to obtain a sheet having a thickness of 140 μm. The dielectric constant and tan δ of the obtained sheet were measured in the same manner as in Example 1. FIG. 2 shows the results.

Example 3

Figure 3:
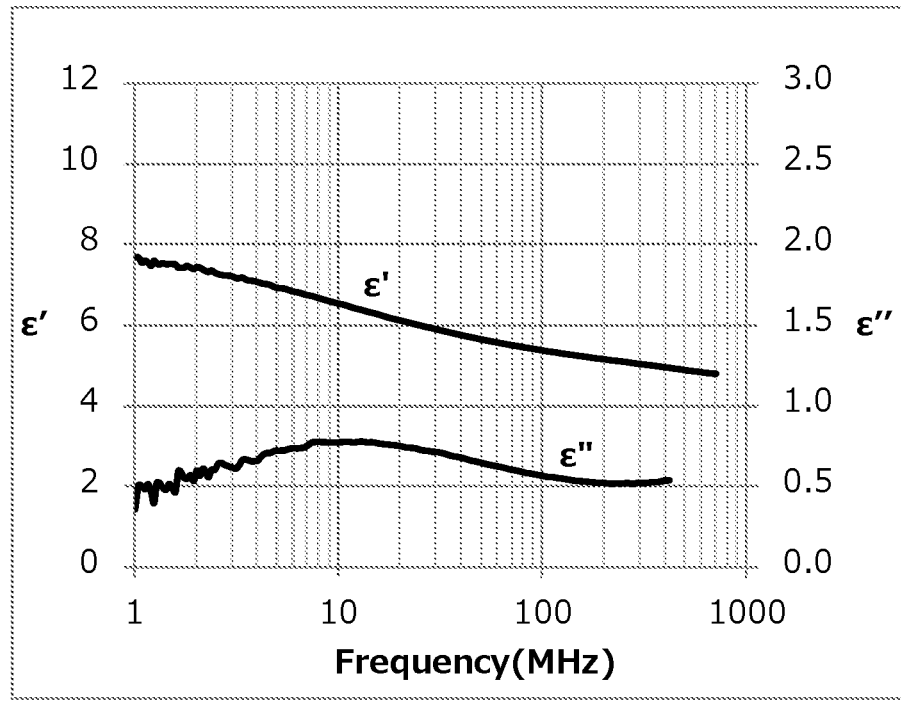
FIG. 3 is a graph showing a dielectric constant $\varepsilon'$ and a dielectric loss $\varepsilon''$ of a sheet obtained in Example 3.

As a fluoropolymer, a VdF/TFE copolymer containing 40 mol % of a VdF unit and 60 mol % of a TFE unit was used. A pellet of this VdF/TFE copolymer was formed into a film with a melt-extruder at 290 to 360° C. to obtain a sheet having a thickness of 230 μm. The dielectric constant and tan δ of the obtained sheet were measured in the same manner as in Example 1. FIG. 3 shows the results.

Example 4

Figure 4:
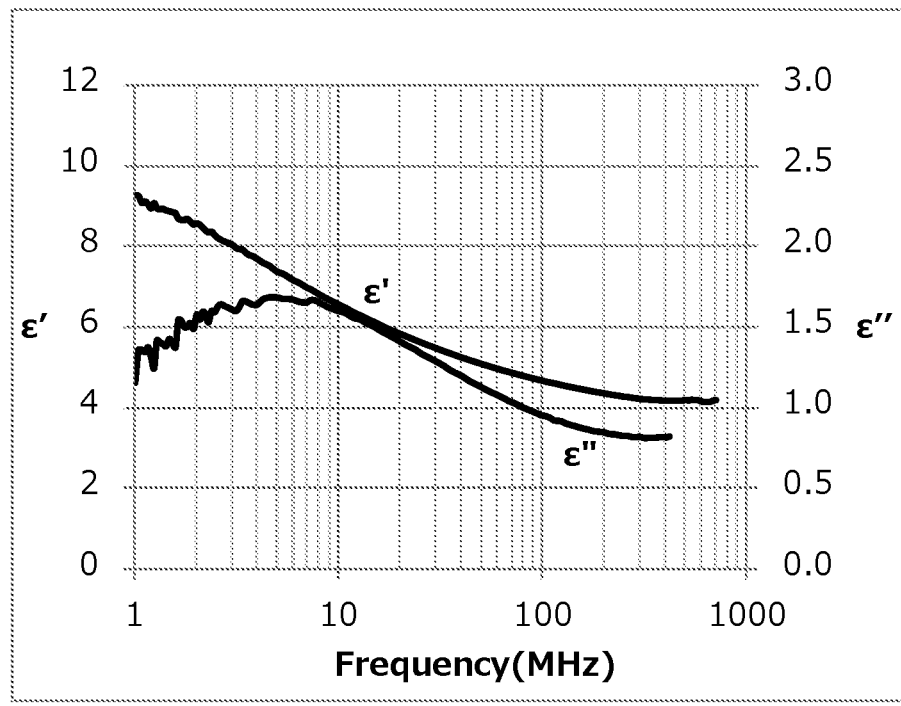
FIG. 4 is a graph showing a dielectric constant $\varepsilon'$ and a dielectric loss $\varepsilon''$ of a sheet obtained in Example 4.

As a fluoropolymer, a VdF/TFE copolymer containing 80 mol % of a VdF unit and 20 mol % of a TFE unit was used. A pellet of this VdF/TFE copolymer was dissolved in N-methyl-2-pyrrolidone to be formed into a cast film with a coating apparatus, and the solvent was volatilized at 180° C. to obtain a sheet having a thickness of 20 μm. The dielectric constant and tan δ of the obtained sheet were measured in the same manner as in Example 1. FIG. 4 shows the results.

Example 5

Figure 5:
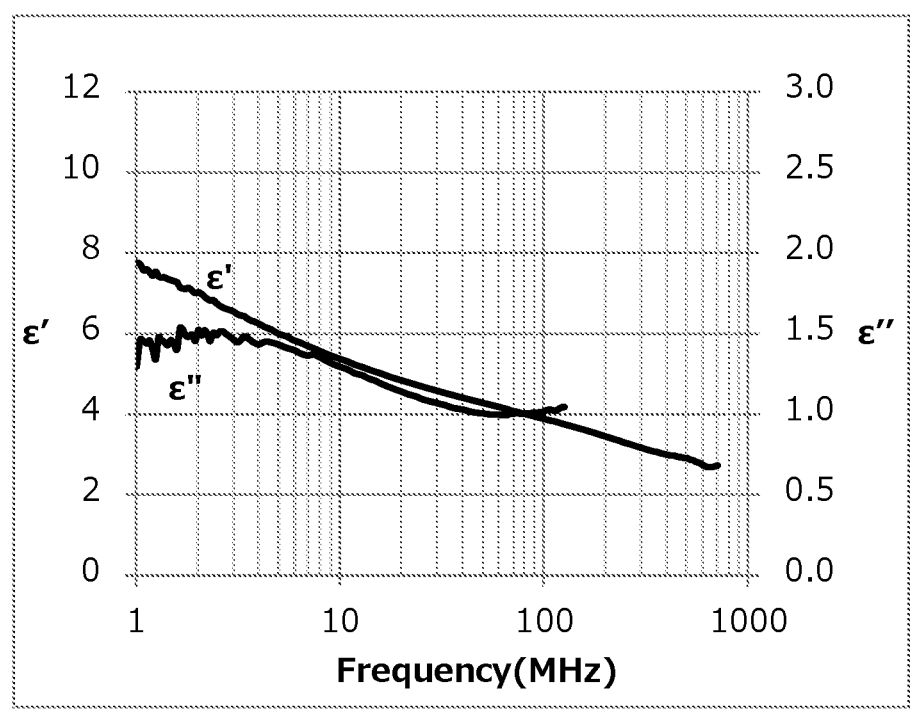
FIG. 5 is a graph showing a dielectric constant $\varepsilon'$ and a dielectric loss $\varepsilon''$ of a sheet obtained in Example 5.

As a fluoropolymer, PVdF containing 100 mol % of a VdF unit was used. A pellet of this PVdF was formed into a film with a melt-extruder at 290 to 360° C. to obtain a sheet having a thickness of 8 μm. The dielectric constant and tan δ of the obtained sheet were measured in the same manner as in Example 1. FIG. 5 shows the results.

Each of FIG. 1 to FIG. 5 is a graph in which the horizontal axis represents a frequency, the vertical axis (left) represents a dielectric constant ε' of each sheet and the vertical axis (right) represents a dielectric loss ε" (the product of ε' and tan δ). As shown in FIG. 1 to FIG. 5, any of the sheets obtained in Examples 1 to 5 has a peak of the dielectric loss ε" in a range of 1 MHz to 100 MHz. In addition, the dielectric constant ε' is lowered gradually in the range of 1 MHz to 100 MHz. Accordingly, realizing a radio wave absorbing sheet having desired radio wave absorbing properties may be expected by designing the thickness or the like.

Next, a radio wave absorbing sheet of one embodiment of the present disclosure will be described with reference to FIG. 6.

Figure 6:
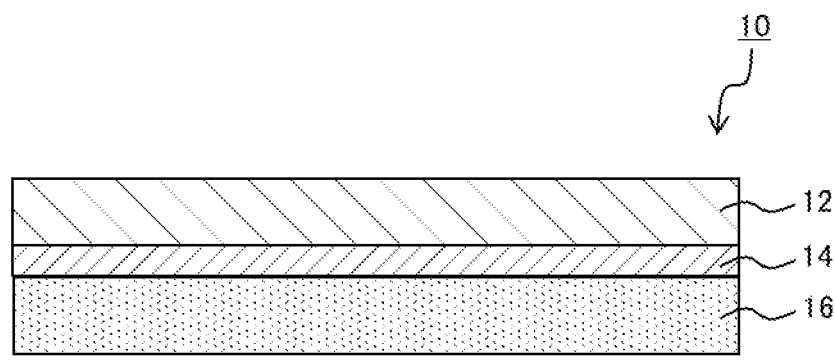
FIG. 6 is a schematic diagram of a radio wave absorbing sheet of one embodiment of the present disclosure.

A radio wave absorbing sheet 10 shown in FIG. 6 is a multilayer sheet including a radio wave absorbing layer formed from a fluoropolymer. As shown in FIG. 6, the radio wave absorbing sheet 10 includes a radio wave absorbing layer 12, a radio wave reflecting layer 14, and an adhesion layer 16.

The radio wave absorbing layer 12 is formed from a radio wave absorbing material, and the radio wave absorbing sheet obtained in Example 1 is used in the present embodiment, and besides, an extruded sheet of a fluoropolymer which is used in the present disclosure, a coating film formed from a solution containing a fluoropolymer which is used in the present disclosure, and the like are utilized. The radio wave reflecting layer 14 is formed from a radio wave reflecting material, and in the present embodiment, the radio wave reflecting layer 14 is a thin aluminum film obtained by vapor-depositing aluminum on a radio wave absorbing sheet.

In the radio wave absorbing sheet 10, the adhesion layer 16 is further provided in such a way that the radio wave absorbing sheet may be pasted to another member. In some embodiments, a mount (not shown in the figure) is provided on the pasting surface in such a way that the pasting surface of the adhesion layer 16 is exposed only when the radio wave absorbing sheet is pasted taking handling properties into consideration.

Part of the radio wave applied on the radio wave absorbing sheet 10 is absorbed by the radio wave absorbing layer 12, and a radio wave not having been absorbed is reflected by the radio wave reflecting layer 14. Accordingly, the radio wave absorbing sheet 10 may be used for measure against noise for an electronic device, prevention of a leak of an electromagnetic wave which is radiated outside from an electronic device, and reduction of an influence of an electromagnetic wave from the outside of an electronic device, and may be provided, for example, in such a way as to cover the surface of a printed wiring board or LSI.

In addition, the radio wave absorbing sheet 10 may be disposed around an antenna coil for performing wireless power supply or near field communication, and, for example, may be pasted to a surface of a resin substrate on the side opposite to a surface having the antenna coil provided thereon. Furthermore, the radio wave absorbing sheet 10 may also be pasted to an electronic component to be disposed around an antenna coil, or may also be disposed between an antenna coil and an electronic component to be disposed around the antenna coil. Using the radio wave absorbing sheet 10 in these ways enables suppressing an electromagnetic wave radiated from an antenna coil or enhancing communication properties of an antenna.

The embodiments have been described above, but it is understood that various changes in the embodiments and the details may be performed without deviating from the gist and scope of the appended claims.

The invention claimed is:

1. A radio wave absorbing material consisting of a fluoropolymer, wherein the fluoropolymer comprises a vinylidene fluoride unit and a tetrafluoroethylene unit, and vinylidene fluoride unit/tetrafluoroethylene unit is 10/90 to 45/55 in terms of a molar ratio, wherein the radio wave absorbing material absorbs a radio wave having a frequency in a range of 1 MHz to 100 MHz.

2. The radio wave absorbing material according to claim 1, to be used for shielding an electromagnetic wave from a wireless power supply module by absorbing the electromagnetic wave generated from the wireless power supply module.

3. A radio wave absorbing sheet comprising a radio wave absorbing layer formed from the radio wave absorbing material according to claim 1.

4. A radio wave absorbing sheet comprising: a radio wave absorbing layer formed from the radio wave absorbing material according to claim 1; and an additional layer different from the radio wave absorbing layer.

5. The radio wave absorbing material according to claim 1, having a dielectric constant $\varepsilon'$ of 2 to 20.

* * * * *